US010097145B1

(12) United States Patent
Khlat et al.

(10) Patent No.: US 10,097,145 B1
(45) Date of Patent: Oct. 9, 2018

(54) MULTI-MODE POWER MANAGEMENT CIRCUIT

(71) Applicant: Qorvo US, Inc., Greensboro, NC (US)

(72) Inventors: Nadim Khlat, Cugnaux (FR); Jeffrey D. Potts, Mocksville, NC (US); Michael R. Kay, Summerfield, NC (US); Michael J. Murphy, Statesville, NC (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/837,496

(22) Filed: Dec. 11, 2017

(51) Int. Cl.
*H03G 3/00* (2006.01)
*H03F 3/19* (2006.01)
*H04B 1/04* (2006.01)
*H03F 3/24* (2006.01)
*H02M 3/07* (2006.01)
*H03F 1/02* (2006.01)
*H03G 3/30* (2006.01)

(52) U.S. Cl.
CPC .............. *H03F 3/19* (2013.01); *H03F 3/24* (2013.01); *H04B 1/04* (2013.01); *H02M 3/07* (2013.01); *H03F 1/0211* (2013.01); *H03F 1/0277* (2013.01); *H03F 2200/451* (2013.01); *H03G 3/004* (2013.01); *H03G 3/3042* (2013.01); *H04B 2001/0408* (2013.01)

(58) Field of Classification Search
CPC ...... H03G 3/3042; H03G 3/004; H03G 3/007; H03F 1/0211; H03F 1/0277; H03F 3/189; H02M 3/07; H02M 2003/077
See application file for complete search history.

(56) References Cited

U.S. PATENT DOCUMENTS

| 6,434,122 | B2 | 8/2002 | Barabash et al. |
| 8,008,970 | B1 | 8/2011 | Homol et al. |
| 8,571,498 | B2 * | 10/2013 | Khlat ............... H03F 1/0244 455/127.1 |
| 8,909,175 | B1 | 12/2014 | McCallister |
| 9,112,452 | B1 * | 8/2015 | Khlat ............... H03F 3/04 |
| 9,484,865 | B2 | 11/2016 | Kobayashi et al. |

(Continued)

OTHER PUBLICATIONS

U.S. Appl. No. 15/678,245, filed Aug. 16, 2017.
(Continued)

*Primary Examiner* — Duc M Nguyen
(74) *Attorney, Agent, or Firm* — Withrow & Terranova, P.L.L.C.

(57) ABSTRACT

A multi-mode power management circuit is provided. The multi-mode power management circuit includes a second generation (2G) amplifier circuit(s) configured to amplify a 2G radio frequency (RF) signal for transmission in a 2G RF band(s). The multi-mode power management circuit includes a pair of tracker circuitries coupled to the 2G amplifier circuit. Each tracker circuitry includes a charge pump circuitry configured to generate a voltage and a current. When the 2G amplifier circuit amplifies the 2G RF signal for transmission in the 2G RF band(s), both charge pump circuitries are controlled to provide two currents to the 2G amplifier circuit. As a result, the 2G amplifier circuit is able to amplify the 2G RF signal to a higher power corresponding to a sum of the two currents for transmission in the 2G RF band(s).

21 Claims, 6 Drawing Sheets

(56) References Cited

U.S. PATENT DOCUMENTS

| | | | |
|---|---|---|---|
| 2006/0244513 A1* | 11/2006 | Yen | H02M 3/07 327/536 |
| 2009/0045877 A1 | 2/2009 | Wang et al. | |
| 2010/0219887 A1 | 9/2010 | Ichitsubo et al. | |
| 2010/0283534 A1* | 11/2010 | Pierdomenico | H03F 3/4508 327/536 |
| 2012/0062205 A1* | 3/2012 | Levesque | H02M 3/1584 323/318 |
| 2012/0176196 A1* | 7/2012 | Khlat | H03G 3/3047 330/127 |
| 2013/0165132 A1 | 6/2013 | Goedken et al. | |
| 2013/0285750 A1 | 10/2013 | Chowdhury et al. | |
| 2013/0307617 A1* | 11/2013 | Khlat | H03F 1/0244 330/127 |
| 2014/0062590 A1* | 3/2014 | Khlat | H03G 3/3042 330/127 |
| 2014/0105327 A1 | 4/2014 | Geng et al. | |
| 2015/0091653 A1 | 4/2015 | Kobayashi et al. | |
| 2016/0164476 A1 | 6/2016 | Wang et al. | |
| 2017/0124013 A1 | 5/2017 | Vaillancourt et al. | |

OTHER PUBLICATIONS

U.S. Appl. No. 15/720,894, filed Sep. 29, 2017.
U.S. Appl. No. 15/825,562, filed Nov. 29, 2017.
U.S. Appl. No. 15/856,143, filed Dec. 28, 2017.
U.S. Appl. No. 15/830,686, filed Dec. 4, 2017.
U.S. Appl. No. 15/836,334, filed Dec. 8, 2017.
Ex Parte Quayle Action for U.S. Appl. No. 15/678,245, dated Jun. 6, 2018, 4 pages.
Notice of Allowance for U.S. Appl. No. 15/825,562, dated Jun. 11, 2018, 8 pages.
Notice of Allowance for U.S. Appl. No. 15/830,686, dated May 24, 2018, 8 pages.

\* cited by examiner

MULTI-MODE POWER MANAGEMENT CIRCUIT

FIELD OF THE DISCLOSURE

The technology of the disclosure relates generally to radio frequency (RF) power amplifier circuits.

BACKGROUND

Mobile communication devices have become increasingly common in current society for providing wireless communication services. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

Fifth-generation (5G) new radio (NR) (5G-NR) wireless communication technology has been widely regarded as the next wireless communication standard beyond the current third-generation (3G) communication standard, such as wideband code division multiple access (WCDMA), and fourth-generation (4G) communication standard, such as long-term evolution (LTE). The 5G-NR wireless communication technology is expected to enable significantly higher data rates, improved coverage range, enhanced signaling efficiency, and reduced latency compared to wireless communication systems based on the 3G and 4G communication standards.

Concurrent to supporting the 3G, 4G, and 5G wireless communication technologies, a mobile communication device may also need to support legacy second-generation (2G) wireless communication technologies, such as wireless communication based on such legacy cellular technologies as global system for mobile communications (GSM), general radio packet service (GPRS), enhanced data rates for GSM evolution (EDGE), and code-division multiple-access (CDMA). Given that 2G radio frequency (RF) bands, such as GSM 850 MHz band, GSM 900 MHz band, GSM 1800 MHz band and GSM 1900 MHz band, are re-farmed in many geographical regions to support 3G and/or 4G communications, it is desirable that the 2G, 3G, 4G, and/or 5G wireless communication technologies can coexist in harmony in the mobile communication device.

SUMMARY

Embodiments of the disclosure relate to a multi-mode power management circuit. The multi-mode power management circuit includes a second generation (2G) amplifier circuit(s) configured to amplify a 2G radio frequency (RF) signal for transmission in a 2G RF band(s). In examples discussed herein, the 2G RF signal may be encoded based on a 2G wireless communication protocol, such as global system for mobile communications (GSM). The multi-mode power management includes a pair of tracker circuitries coupled to the 2G amplifier circuit. Each tracker circuitry includes a charge pump circuitry configured to generate a voltage and a current. When the 2G amplifier circuit amplifies the 2G RF signal for transmission in the 2G RF band(s), both charge pump circuitries are controlled to provide two currents to the 2G amplifier circuit. As a result, the 2G amplifier circuit is able to amplify the 2G RF signal to a higher power corresponding to a sum of the two currents for transmission in the 2G RF band(s).

In one aspect, a multi-mode power management circuit is provided. The multi-mode power management circuit includes a 2G amplifier circuit configured to amplify a 2G RF signal encoded based on a 2G communication protocol for transmission in a 2G RF band. The multi-mode power management circuit also includes switching circuitry comprising a 2G output port coupled to the 2G amplifier circuit. The multi-mode power management circuit also includes first tracker circuitry having a first tracker output coupled to the switching circuitry and comprises first charge pump circuitry configured to generate a first voltage and a first current. The multi-mode power management circuit also includes second tracker circuitry having a second tracker output coupled to the switching circuitry and comprises second charge pump circuitry configured to generate a second voltage and a second current. The multi-mode power management circuit also includes control circuitry configured to control the switching circuitry to couple the first charge pump circuitry and the second charge pump circuitry to the 2G output port to provide the first current and the second current to the 2G amplifier circuit in a 2G-high-power (2GHP) mode. The 2G amplifier circuit is further configured to amplify the 2G RF signal to a defined power corresponding to a sum of the first current and the second current.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
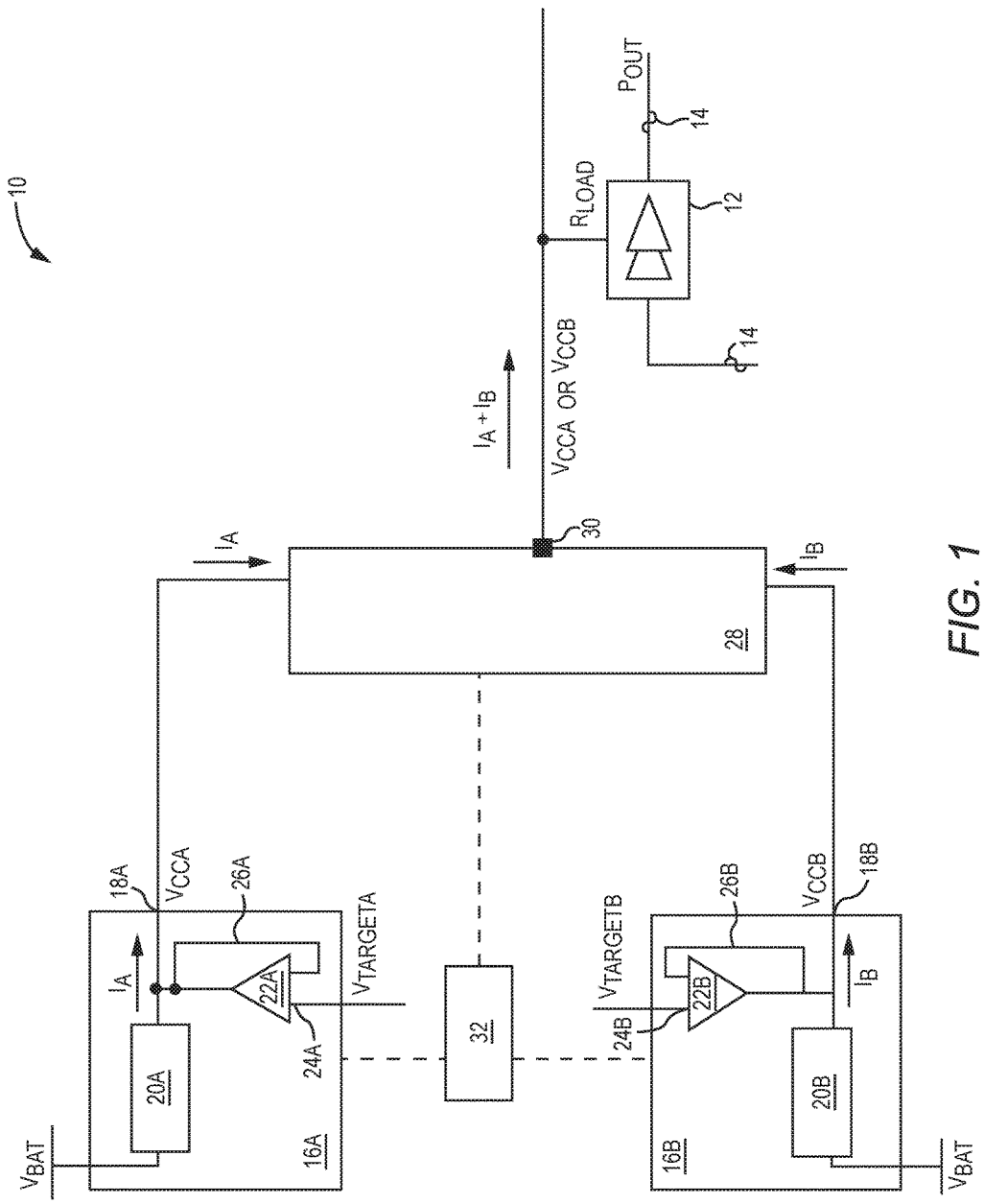
FIG. 1 is a schematic diagram of an exemplary multi-mode power management circuit configured to support at least one second-generation (2G) amplifier circuit configured to amplify a 2G radio frequency (RF) signal in a 2G-high-power (2GHP) mode or a 2G-low-power (2GLP) mode for transmission in at least one 2G RF band.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to a multi-mode power management circuit. The multi-mode power management circuit includes a secondary generation (2G) amplifier circuit(s) configured to amplify a 2G radio frequency (RF) signal for transmission in a 2G RF band(s). In examples discussed herein, the 2G RF signal may be encoded based on a 2G wireless communication protocol, such as global system for mobile communications (GSM). The multi-mode power management includes a pair of tracker circuitries coupled to the 2G amplifier circuit. Each tracker circuitry includes a charge pump circuitry configured to generate a voltage and a current. When the 2G amplifier circuit amplifies the 2G RF signal for transmission in the 2G RF band(s), both charge pump circuitries are controlled to provide two currents to the 2G amplifier circuit. As a result, the 2G amplifier circuit is able to amplify the 2G RF signal to a higher power corresponding to a sum of the two currents for transmission in the 2G RF band(s).

In this regard, FIG. 1 is a schematic diagram of an exemplary multi-mode power management circuit 10 configured to support at least one 2G amplifier circuit 12 configured to amplify a 2G RF signal 14 in a 2G-high-power (2GHP) mode or a 2G-low-power (2GLP) mode for transmission in at least one 2G RF band. Notably, the multi-mode power management circuit 10 can include additional amplifier circuits configured to amplify additional RF signals for transmission in additional RF bands, such as third-generation (3G) RF bands, fourth-generation (4G) RF bands, and/or fifth-generation new radio (5G-NR) RF bands. These additional amplifier circuits are not shown in FIG. 1 merely for the sake of simplicity and should not be regarded as being limiting.

In a non-limiting example, the 2G RF signal 14 is encoded based on a 2G communication protocol, such GSM protocol, general packet radio service (GPRS) protocol, and enhanced data rates for GSM evolution (EDGE) protocol. Accordingly, the 2G RF signal 14 can be transmitted in such 2G cellular bands as GSM 850 MHz band, GSM 900 MHz band, GSM 1800 MHz band, and/or GSM 1900 MHz band.

In examples discussed hereinafter, the multi-mode power management circuit 10 can be configured to support a 2G-high-power (2GHP) mode and a 2G-low-power (2GLP) mode. In a non-limiting example, in the 2GHP mode, the 2G amplifier circuit 12 amplifies the 2G RF signal 14 to a defined power $P_{OUT}$ greater than or equal to 30 dBm (≥30 dBm). In contrast, in the 2GLP mode, the 2G amplifier circuit 12 amplifies the 2G RF signal 14 to the defined power $P_{OUT}$ less than 30 dBm (<30 dBm).

The multi-mode power management circuit 10 includes first tracker circuitry 16A and second tracker circuitry 16B. The first tracker circuitry 16A includes a first tracker output 18A coupled to the 2G amplifier circuit 12. The first tracker circuitry 16A includes first charge pump circuitry 20A and a first parallel amplifier 22A. The first charge pump circuitry 20A receives a battery voltage $V_{BAT}$ and generates a first current $I_A$, which can be a direct current (DC) current, an alternate current (AC) current, or a combination of both, at the first tracker output 18A. The first charge pump circuitry 20A can also generate a first voltage $V_{CCA}$, which will be an average power tracking (APT) voltage, at the first tracker output 18A. The first parallel amplifier 22A is configured to generate a first modulated voltage $V_{CCA}$, which will be an envelope tracking (ET) modulated voltage, at the first tracker output 18A. In this regard, the first parallel amplifier 22A receives a first target voltage $V_{TARGETA}$ at a first voltage input 24A and generates the first modulated voltage $V_{CCA}$ tracking the first target voltage $V_{TARGETA}$. The first target voltage $V_{TARGETA}$ can be an ET voltage. Accordingly, the first parallel amplifier 22A generates the first modulated voltage $V_{CCA}$ as a first ET modulated voltage. The first parallel amplifier 22A is coupled to a first feedback loop 26A, which provides a sample of the first modulated voltage $V_{CCA}$ back to the first parallel amplifier 22A.

The second tracker circuitry 16B includes a second tracker output 18B coupled to the 2G amplifier circuit 12. The second tracker circuitry 16B includes second charge pump circuitry 20B and a second parallel amplifier 22B. The second charge pump circuitry 20B receives the battery voltage $V_{BAT}$ and generates a second current $I_B$, which can be a DC current, an AC current, or a combination of both, at the second tracker output 18B. The second charge pump circuitry 20B can also generate a second voltage $V_{CCB}$, which will be an APT voltage, at the second tracker output 18B. The second parallel amplifier 22B is configured to generate a second modulated voltage $V_{CCB}$, which will be an ET modulated voltage, at the second tracker output 18B. In this regard, the second parallel amplifier 22B receives a second target voltage $V_{TARGETB}$ at a second voltage input 24B and generates the second modulated voltage $V_{CCB}$ tracking the second target voltage $V_{TARGETB}$. The second target voltage $V_{TARGETB}$ can be an ET voltage. Accordingly, the second parallel amplifier 22B generates the second modulated voltage $V_{CCB}$ as a second ET modulated voltage. The second parallel amplifier 22B is coupled to a second feedback loop 26B, which provides a sample of the second modulated voltage $V_{CCB}$ back to the second parallel amplifier 22B.

The multi-mode power management circuit 10 includes switching circuitry 28. The switching circuitry 28 includes a 2G output port 30 coupled to the 2G amplifier circuit 12. The switching circuitry 28 is coupled to the first tracker circuitry 16A and the second tracker circuitry 16B. In a non-limiting example, the 2G output port 30 is a port dedicated to coupling the 2G amplifier circuit 12 to the first tracker circuitry 16A and/or the second tracker circuitry 16B. As is further discussed later with reference to FIG. 3, the switching circuitry 28 includes one or more switches that can be individually or concurrently controlled to provide the first current $I_A$, the second current $I_B$, the first voltage $V_{CCA}$, and/or the second voltage $V_{CCB}$ to the 2G amplifier circuit 12 in the 2GHP mode and the 2GLP mode.

The multi-mode power management circuit 10 includes control circuitry 32, which may be implemented by a microprocessor, a microcontroller, or a field-programmable gate array (FPGA). In both the 2GHP mode and the 2GLP mode, the control circuitry 32 controls the switching circuitry 28 to couple the first charge pump circuitry 20A and the second charge pump circuitry 20B to the 2G output port 30 to provide the first current $I_A$ and the second current $I_B$ to the 2G amplifier circuit 12. As such, the 2G amplifier circuit 12 receives a sum of the first current $I_A$ and the second current $I_B$ ($I_A+I_B$) in both the 2GHP mode and the 2GLP mode. Accordingly, the 2G amplifier circuit 12 can amplify the 2G RF signal 14 to the defined power $P_{OUT}$ corresponding to the sum of the first current $I_A$ and the second current $I_B$. In a non-limiting example, the first current $I_A$ substantially equals the second current $I_B$ (e.g., $I_A=I_B\pm0.1$ mA). In this regard, each of the first charge pump circuitry 20A and the second charge pump circuitry 20B contributes approximately one-half (½) of the total current flowing through the 2G amplifier circuit 12. Notably, the defined power $P_{OUT}$ in the 2GLP mode is less than the defined power $P_{OUT}$ in the 2GHP mode. Accordingly, the first current $I_A$ and the second current $I_B$ provided to the 2G amplifier circuit 12 can each be at a reduced amount relative to the first current $I_A$ and the second current $I_B$ provided to the 2G amplifier circuit 12 in the 2GHP mode. Alternatively, it may also be possible for the control circuitry 32 to control the switching circuitry 28 to couple the first charge pump circuitry 20A or the second charge pump circuitry 20B to the 2G output port 30 to provide the first current $I_A$ or the second current $I_B$ to the 2G amplifier circuit 12.

In addition, in the 2GHP mode and the 2GLP mode, the control circuitry 32 controls the switching circuitry 28 to provide either the first voltage $V_{CCA}$ or the second voltage $V_{CCB}$ to the 2G amplifier circuit 12. Notably, the first voltage $V_{CCA}$ or the second voltage $V_{CCB}$ is generated as an APT voltage (e.g., constant voltage), as opposed to being an ET voltage. Accordingly, the 2G amplifier circuit 12 amplifies the 2G RF signal 14 to the defined power $P_{OUT}$ corresponding to the first voltage $V_{CCA}$ or the second voltage $V_{CCB}$ multiplied by the sum of the first current $I_A$ and the second current $I_B$ [$P_{OUT}=V_{CCA}\times(I_A+I_B)$ or $P_{OUT}=V_{CCB}\times(I_A+I_B)$].

In a non-limiting example, when the first voltage $V_{CCA}$ or the second voltage $V_{CCB}$ is maintained at 5 V, the first charge pump circuitry 20A can generate the first current $I_A$ up to 330 mA. Likewise, the second charge pump circuitry 20B can generate the second current $I_B$ up to 330 mA. Accordingly, in the 2GHP mode, if the 2G amplifier circuit 12 operates at a power amplifier efficiency (PAE) of 45% for example, the 2G amplifier circuit 12 would be able to amplify the 2G RF signal 14 up to 31.72 dBm. By increasing or decreasing the first current $I_A$ and the second current $I_B$, it is possible to control the defined power $P_{OUT}$ of the 2G RF signal 14, thus enabling the multi-mode power management circuit 10 to efficiently switch between the 2GHP mode and the 2GLP mode without adding additional cost and size overhead.

In a non-limiting example, each of the first charge pump circuitry 20A and the second charge pump circuitry 20B can include a capacitor(s) and/or an inductor(s). Notably, the capacitor(s) and/or the inductor(s) are not ideal components providing only capacitance and/or inductances. As a result, the capacitor(s) and/or the inductor(s) can create additional resistance, which is commonly defined and measured as equivalent series resistance (ESR), in the multi-mode power management circuit 10. The ESR may cause a dropout in the first voltage $V_{CCA}$ and/or the second voltage $V_{CCB}$, thus reducing efficiency of the multi-mode power management circuit 10. As such, it may be desirable to configure the first charge pump circuitry 20A and the second charge pump circuitry 20B in the 2GHP mode and the 2GLP mode to help reduce the ESR in the multi-mode power management circuit 10.

Figure 2A:
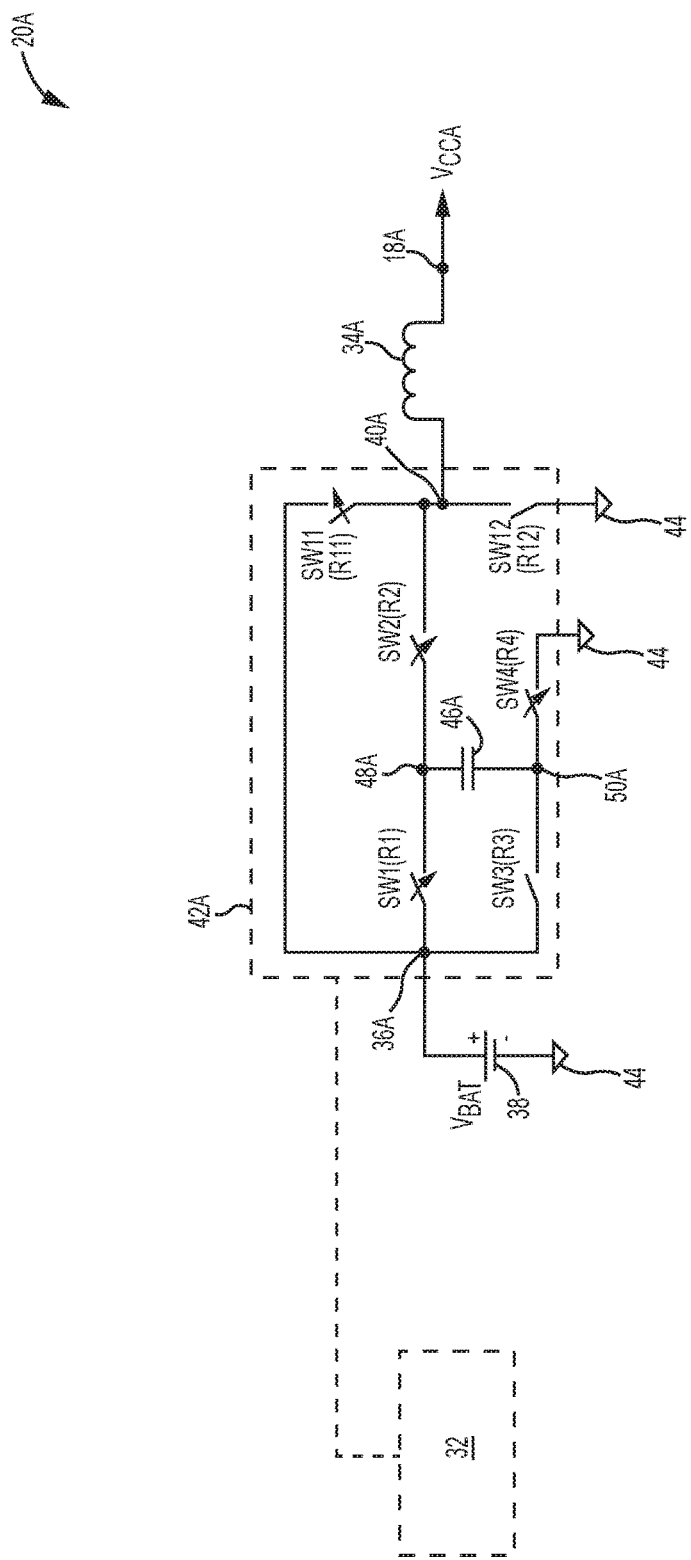
FIGS. 2A-2B are schematic diagrams providing exemplary illustrations of charge pump circuitries in the multi-mode power management circuit of FIG. 1 configured to reduce equivalent series resistance (ESR) in the multi-mode power management circuit.

In this regard, FIG. 2A is a schematic diagram providing an exemplary illustration of the first charge pump circuitry 20A of FIG. 1 configured to reduce ESR in the multi-mode power management circuit 10. Common elements between FIGS. 1 and 2A are shown therein with common element numbers and will not be re-described herein.

The first charge pump circuitry 20A includes a first power inductor 34A coupled to the first tracker output 18A. The first charge pump circuitry 20A also includes a first input node 36A coupled to a battery 38 to receive a battery voltage $V_{BAT}$. The first charge pump circuitry 20A also includes a first output node 40A coupled to the first power inductor 34A. The first charge pump circuitry 20A also includes a first boost charge pump 42A coupled between the first input node 36A and the first output node 40A.

The first charge pump circuitry 20A includes a first switch SW1 and a second switch SW2 provided in series between the first input node 36A and the first output node 40A. The first switch SW1 and the second switch SW2 inherently have a first resistance R1 and a second resistance R2, respectively. The first charge pump circuitry 20A also includes a third switch SW3 and a fourth switch SW4 provided in series between the first input node 36A and a ground 44, in parallel to the first switch SW1 and the second switch SW2. The third switch SW3 and the fourth switch SW4 inherently have a third resistance R3 and a fourth resistance R4, respectively. The first charge pump circuitry 20A also includes a fifth switch SW11 provided between the first input node 36A and the first output node 40A in parallel to the first switch SW1 and the second switch SW2. The first charge pump circuitry 20A also includes a sixth switch SW12 provided between the first output node 40A and the ground 44. The fifth switch SW11 and the sixth switch SW12 inherently have a fifth resistance R11 and a sixth resistance R12, respectively. The first charge pump circuitry 20A also includes a first capacitor 46A having a first end 48A coupled between the first switch SW1 and the second switch SW2 and a second end 50A coupled between the third switch SW3 and the fourth switch SW4.

In the 2GHP mode and the 2GLP mode, the control circuitry 32 controls the first charge pump circuitry 20A to close the first switch SW1, the second switch SW2, the fourth switch SW4, and the fifth switch SW11, while opening the third switch SW3 and the sixth switch SW12. As such, the switch SW1 and the switch SW2 are coupled in parallel to the fifth switch SW11. As a result, overall resistance associated with the first switch SW1, the second switch SW2, and the fifth switch SW11 is reduced to (R1+R2)∥R11, thus helping to reduce ESR of the first charge pump circuitry 20A. In addition, by opening the third switch SW3 and closing the fourth switch SW4, the first capacitor 46A can act as a decoupling capacitor to help further reduce the ESR of the first charge pump circuitry 20A.

Figure 2B:
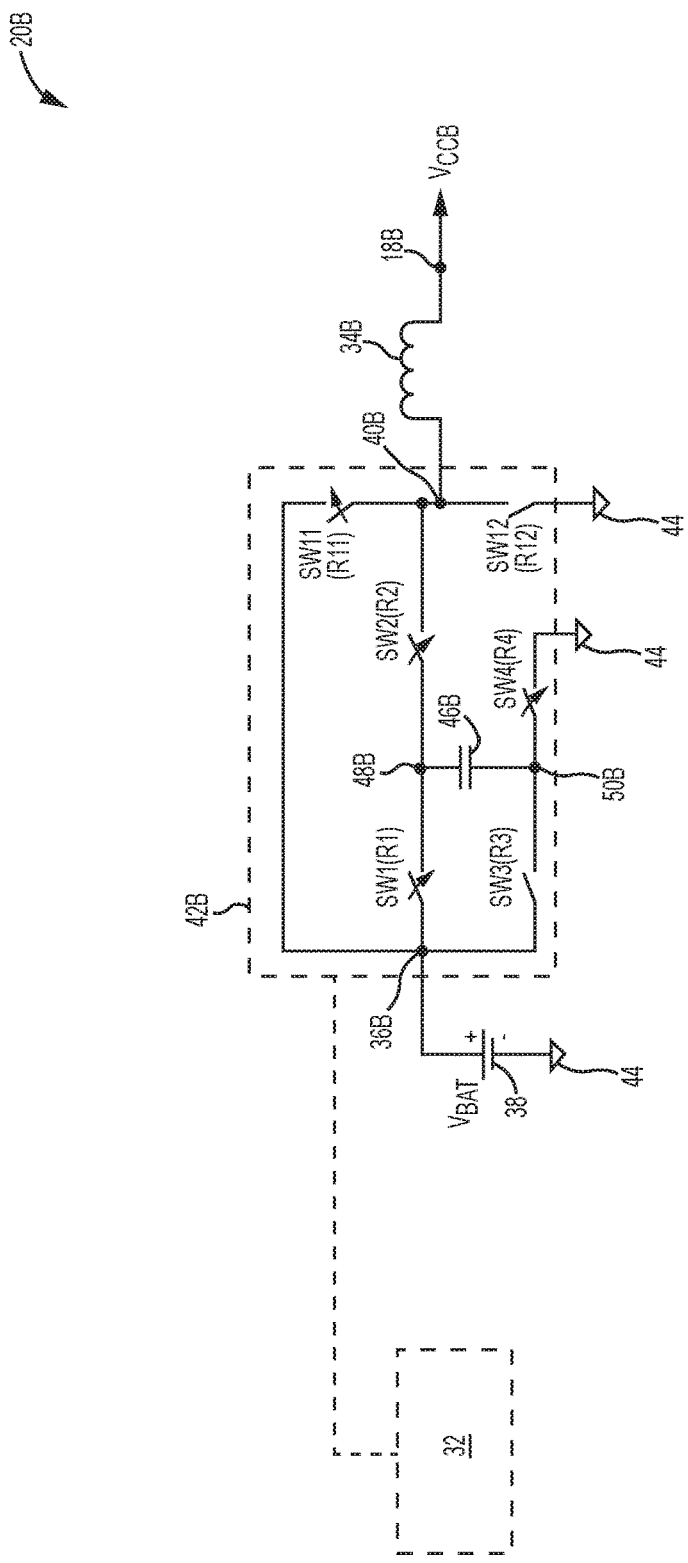

FIG. 2B is a schematic diagram providing an exemplary illustration of the second charge pump circuitry 20B of FIG. 1 configured to reduce ESR in the multi-mode power management circuit 10. Common elements between FIGS. 1, 2A, and 2B are shown therein with common element numbers and will not be re-described herein.

The second charge pump circuitry 20B includes a second power inductor 34B coupled to the second tracker output 18B. The second charge pump circuitry 20B also includes a second input node 36B coupled to the battery 38 to receive the battery voltage $V_{BAT}$. The second charge pump circuitry 20B also includes a second output node 40B coupled to the second power inductor 34B. The second charge pump circuitry 20B also includes a second boost charge pump 42B coupled between the second input node 36B and the second output node 40B.

Similar to the first charge pump circuitry 20A, the second charge pump circuitry 20B also includes a first switch SW1 and a second switch SW2 provided in series between the second input node 36B and the second output node 40B. The first switch SW1 and the second switch SW2 inherently have a first resistance R1 and a second resistance R2, respectively. The second charge pump circuitry 20B also includes a third switch SW3 and a fourth switch SW4 provided in series between the second input node 36B and the ground 44, in parallel to the first switch SW1 and the second switch SW2. The third switch SW3 and the fourth switch SW4 inherently have a third resistance R3 and a fourth resistance R4, respectively. The second charge pump circuitry 20B also includes a fifth switch SW11 provided between the second input node 36B and the second output node 40B in parallel to the first switch SW1 and the second switch SW2. The second charge pump circuitry 20B also includes a sixth switch SW12 provided between the second output node 40B and the ground 44. The fifth switch SW11 and the sixth switch SW12 inherently have a fifth resistance R11 and a sixth resistance R12, respectively. The second charge pump circuitry 20B also includes a second capacitor 46B having a first end 48B coupled between the first switch SW1 and the second switch SW2 and a second end 50B coupled between the third switch SW3 and the fourth switch SW4.

In the 2GHP mode and the 2GLP mode, the control circuitry 32 controls the second charge pump circuitry 20B to close the first switch SW1, the second switch SW2, the fourth switch SW4, and the fifth switch SW11, while opening the third switch SW3 and the sixth switch SW12. As such, the switch SW1 and the switch SW2 are coupled in parallel to the fifth switch SW11. As a result, overall resistance associated with the first switch SW1, the second switch SW2, and the fifth switch SW11 is reduced to (R1+R2)∥R11, thus helping to reduce ESR of the second charge pump circuitry 20B. In addition, by opening the third switch SW3 and closing the fourth switch SW4, the second capacitor 46B can act as a decoupling capacitor to help further reduce the ESR of the second charge pump circuitry 20B.

In this regard, in the 2GHP mode and the 2GLP mode, the control circuitry 32 can concurrently control the first charge pump circuitry 20A and the second charge pump circuitry 20B according to the switching mechanism described above in FIGS. 2A and 2B. As a result, it is possible to concurrently reduce the ESR associated with the first charge pump circuitry 20A and the second charge pump circuitry 20B, thus helping to improve overall efficiency of the multi-mode power management circuit 10. In a non-limiting example, a simulation indicates that the overall efficiency of the multi-mode power management circuit 10 can be improved by approximately 1% as a result of the ESR reduction in the first charge pump circuitry 20A and the second charge pump circuitry 20B.

Figure 3:
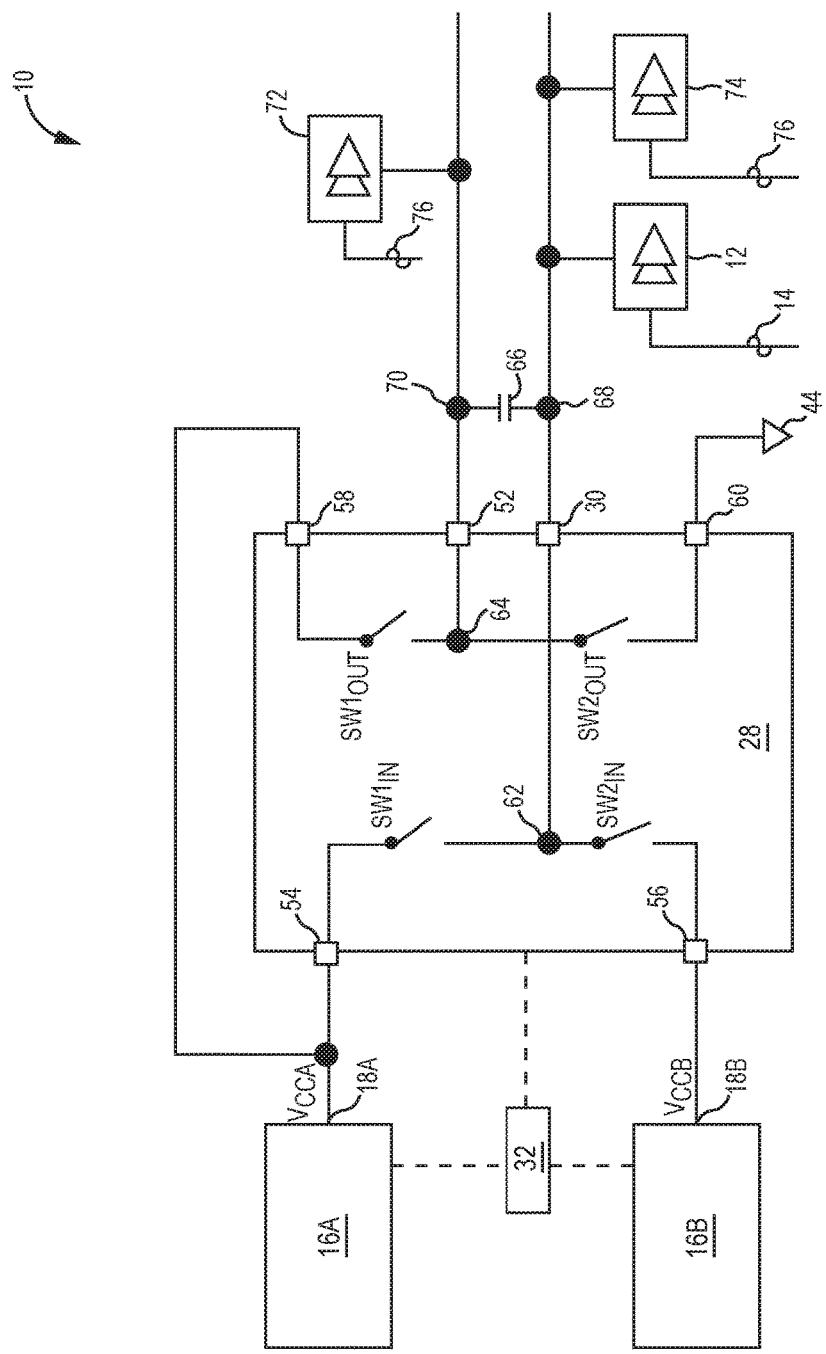
FIG. 3 is a schematic diagram providing an exemplary illustration of switching circuitry in the multi-mode power management circuit of FIG. 1 according to one embodiment of the present disclosure.

As previously mentioned in FIG. 1, the switching circuitry 28 includes switches that can be individually or concurrently controlled to provide the first current $I_A$, the second current $I_B$, the first voltage $V_{CCA}$, and/or the second voltage $V_{CCB}$ to the 2G amplifier circuit 12 in the 2GHP mode and the 2GLP mode. In this regard, FIG. 3 is a schematic diagram providing an exemplary illustration of the switching circuitry 28 of FIG. 1 according to one embodiment of the present disclosure. Common elements between FIGS. 1 and 3 are shown therein with common element numbers and will not be re-described herein.

The switching circuitry 28 includes an auxiliary output port 52, a first input port 54, a second input port 56, a third input port 58, and a fourth input port 60. In a non-limiting example, the first input port 54 and the third input port 58 are coupled to the first tracker output 18A. In the same non-limiting example, the second input port 56 is coupled to the second tracker output 18B and the fourth input port 60 is coupled to the ground 44.

The switching circuitry 28 also includes a first input switch $SW1_{IN}$, a second input switch $SW2_{IN}$, a first output switch $SW1_{OUT}$, and a second output switch $SW2_{OUT}$. The first input switch $SW1_{IN}$ and the second input switch $SW2_{IN}$ are provided in series between the first input port 54 and the second input port 56. The first input switch $SW1_{IN}$ is coupled to the second input switch $SW2_{IN}$ at a first coupling node 62, which is further coupled to the 2G output port 30. The first output switch $SW1_{OUT}$ and the second output switch $SW2_{OUT}$ are provided in series between the third input port 58 and the fourth input port 60. The first output switch $SW1_{OUT}$ is coupled to the second output switch $SW2_{OUT}$ at a second coupling node 64, which is further coupled to the auxiliary output port 52. The switching circuitry 28 also includes a decoupling capacitor 66. The decoupling capacitor 66 has a first end 68 coupled to the 2G output port 30 and a second end 70 coupled to the auxiliary output port 52.

In a non-limiting example, the 2G amplifier circuit 12 is coupled to the 2G output port 30 via the first end 68 of the decoupling capacitor 66. In this regard, in the 2GHP mode and the 2GLP mode, the control circuitry 32 can close the second output switch $SW2_{OUT}$ to couple the auxiliary output port 52 to the ground 44. In the 2GHP mode and the 2GLP mode, the control circuitry 32 may close the first input switch $SW1_{IN}$ or the second input switch $SW2_{IN}$ to provide the first voltage $V_{CCA}$ or the second voltage $V_{CCB}$ to the 2G output port 30 and thus the 2G amplifier circuit 12.

As previously described in FIG. 1, the multi-mode power management circuit 10 can include additional amplifier circuits configured to amplify additional RF signals for transmission in additional RF bands, such as 3G RF bands, 4G RF bands, and/or 5G-NR RF bands. In a non-limiting example, the multi-mode power management circuit 10 can include a first non-2G amplifier circuit 72 and a second non-2G amplifier circuit 74. The first non-2G amplifier circuit 72 is configured to amplify a non-2G RF signal 76 for transmission in at least one first non-2G RF band. The second non-2G amplifier circuit 74 is configured to amplify the non-2G RF signal 76 for transmission in at least one second non-2G RF band. For example, the non-2G RF signal 76 may be encoded based on a 3G communication protocol, such as wideband code-division multiple-access (WCDMA), a 4G communication protocol, such as long-term evolution (LTE), or a 5G-NR communication protocol. Accordingly, the first non-2G amplifier circuit 72 and/or the second non-2G amplifier circuit 74 can amplify the non-2G RF signal 76 for transmission in a 3G RF band, a 4G RF band, or a 5G RF band.

In a non-limiting example, the first non-2G amplifier 72 and the second non-2G amplifier circuit 74 can be configured to amplify the non-2G RF signal 76 for concurrent transmission in an uplink carrier aggregation (ULCA) mode. In this regard, the control circuitry 32 may close the first output switch $SW1_{OUT}$ to couple the first non-2G amplifier circuit 72 to the first tracker output 18A. The control circuitry 32 may concurrently close the second input switch $SW2_{IN}$ to couple the second non-2G amplifier circuit 74 to the second tracker output 18B. In the ULCA mode, the control circuitry may open the second output switch $SW2_{OUT}$ to decouple the decoupling capacitor 66 from the auxiliary output port 52. Given that the first tracker circuitry 16A is providing the first voltage $V_{CCA}$ to the first non-2G amplifier circuit 72, the control circuitry 32 may further open the first input switch $SW1_{IN}$.

In a non-limiting example, the control circuitry 32 may activate the first parallel amplifier 22A and the second parallel amplifier 22B, as shown in FIG. 1, to provide the first modulated voltage $V_{CCA}$ and the second modulated voltage $V_{CCB}$ to the first non-2G amplifier circuit 72 and the second non-2G amplifier circuit 74, respectively. In this regard, the first non-2G amplifier circuit 72 and the second non-2G amplifier circuit 74 can amplify the non-2G RF signal 76 based on ET modulation.

Figure 4A:
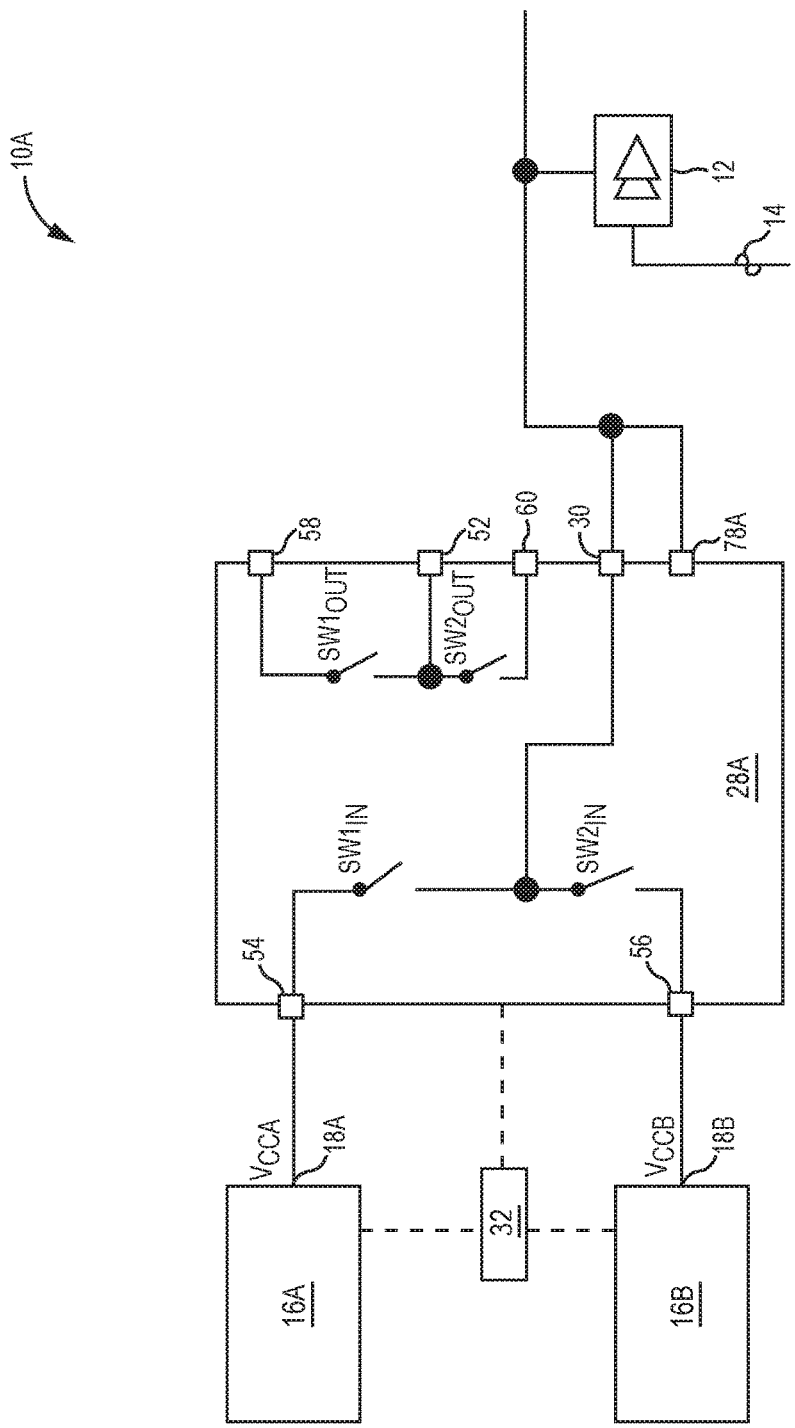
FIG. 4A is a schematic diagram of an exemplary multi-mode power management circuit according another embodiment of present disclosure.

Two alternative embodiments of the switching circuitry 28 are now discussed with reference to FIGS. 4A and 4B. FIG. 4A is a schematic diagram of an exemplary multi-mode power management circuit 10A according another embodiment of present disclosure. Common elements between FIGS. 1, 3, and 4A are shown therein with common element numbers and will not be re-described herein.

As illustrated in FIG. 4A, the multi-mode power management circuit 10A includes switching circuitry 28A. The switching circuitry 28A further includes a fifth input port 78A that can be coupled to the 2G output port 30 to help reduce the ESR in the 2GHP mode and the 2GLP mode.

Figure 4B:
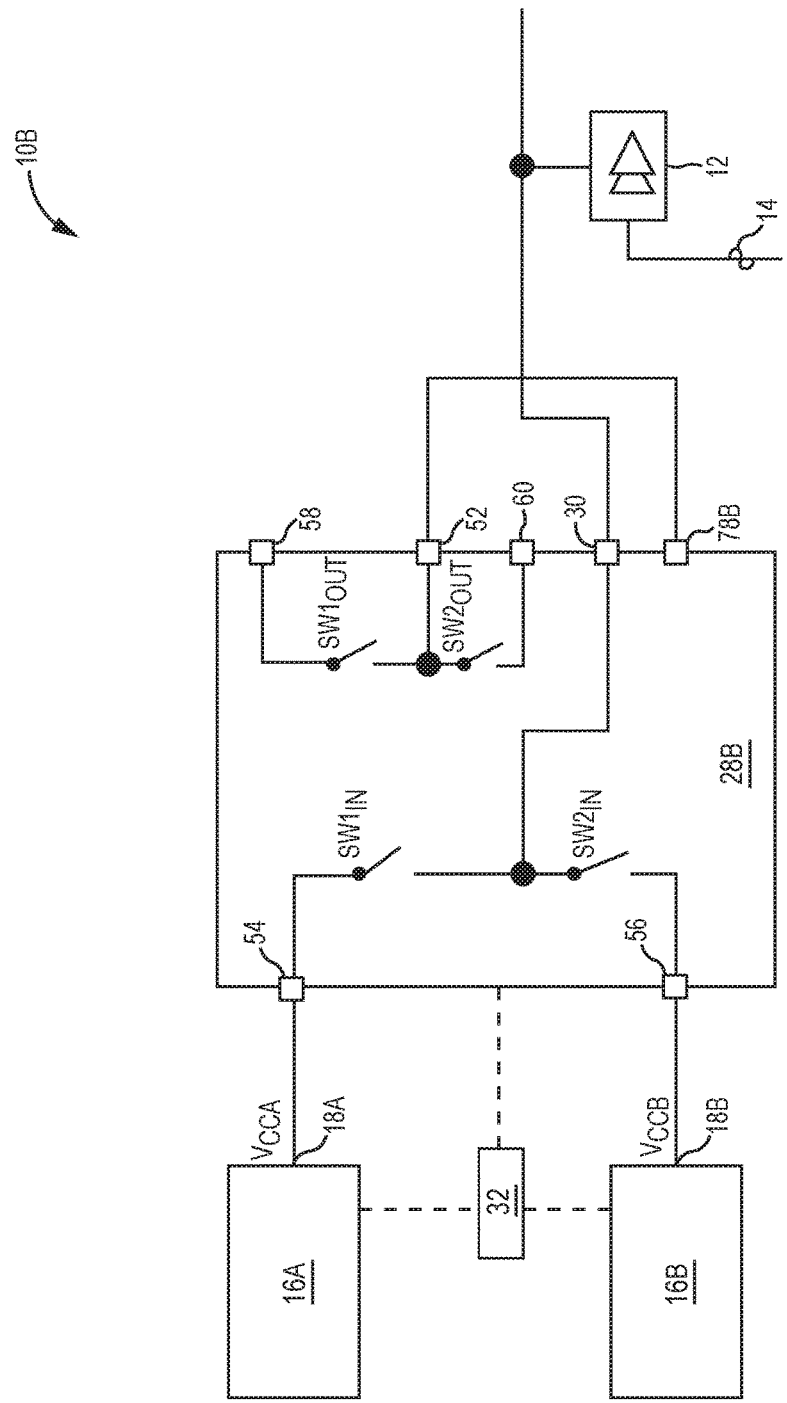
FIG. 4B is a schematic diagram of an exemplary multi-mode power management circuit according another embodiment of present disclosure.

FIG. 4B is a schematic diagram of an exemplary multi-mode power management circuit 10B according another embodiment of present disclosure. Common elements between FIGS. 1, 3, and 4B are shown therein with common element numbers and will not be re-described herein.

As illustrated in FIG. 4B, the multi-mode power management circuit 10B includes switching circuitry 28B. The switching circuitry 28B further includes a fifth input port 78B that can be coupled to the auxiliary output port 52 to help reduce the ESR in the 2GHP mode and the 2GLP mode.

Those skilled in the art will recognize improvements and modifications to the preferred embodiments of the present disclosure. All such improvements and modifications are considered within the scope of the concepts disclosed herein and the claims that follow.

What is claimed is:

1. A multi-mode power management circuit comprising:
    a second-generation (2G) amplifier circuit configured to amplify a 2G radio frequency (RF) signal encoded based on a 2G communication protocol for transmission in a 2G RF band;
    switching circuitry comprising a 2G output port coupled to the 2G amplifier circuit;
    first tracker circuitry having a first tracker output coupled to the switching circuitry and comprising first charge pump circuitry configured to generate a first voltage and a first current;
    second tracker circuitry having a second tracker output coupled to the switching circuitry and comprising second charge pump circuitry configured to generate a second voltage and a second current; and
    control circuitry configured to control the switching circuitry to couple the first charge pump circuitry and the second charge pump circuitry to the 2G output port to provide the first current and the second current to the 2G amplifier circuit in a 2G-high-power (2GHP) mode;
    wherein the 2G amplifier circuit is further configured to amplify the 2G RF signal to a defined power corresponding to a sum of the first current and the second current.

2. The multi-mode power management circuit of claim 1 wherein the control circuitry is further configured to control the switching circuitry to couple the first charge pump circuitry and the second charge pump circuitry to the 2G output port to provide the first current and the second current to the 2G amplifier circuit in a 2G-low-power (2GLP) mode, wherein the first current and the second current provided in the 2GLP mode are each at a reduced amount relative to the first current and the second current provided in the 2GHP mode.

3. The multi-mode power management circuit of claim 1 wherein the control circuitry is further configured to control the switching circuitry to couple the first charge pump circuitry or the second charge pump circuitry to the 2G output port to provide the first current or the second current to the 2G amplifier circuit in a 2G-low-power (2GLP) mode.

4. The multi-mode power management circuit of claim 1 wherein the first current substantially equals the second current.

5. The multi-mode power management circuit of claim 1 wherein the 2G RF signal is encoded based on the 2G communication protocol selected from the group consisting of: a global system for mobile communications (GSM) protocol; a general packet radio service (GPRS) protocol; an enhanced data rates for GSM evolution (EDGE) protocol; and a code-division multiple-access (CDMA) protocol.

6. The multi-mode power management circuit of claim 1 wherein the 2G RF signal is transmitted in a 2G RF band selected from the group consisting of: a global system for mobile communications (GSM) 850 MHz band; a GSM 900 MHz band; a GSM 1800 MHz band; and a GSM 1900 MHz band.

7. The multi-mode power management circuit of claim 1 wherein:
the first charge pump circuitry comprises:
a first power inductor coupled to the first tracker output;
a first input node coupled to a battery;
a first output node coupled to the first power inductor; and
a first boost charge pump coupled between the first input node and the first output node; and
the second charge pump circuitry comprises:
a second power inductor coupled to the second tracker output;
a second input node coupled to the battery;
a second output node coupled to the second power inductor; and
a second boost charge pump coupled between the second input node and the second output node.

8. The multi-mode power management circuit of claim 7 wherein each of the first boost charge pump and the second boost charge pump comprises:
a first switch and a second switch provided in series between the first input node and the first output node;
a third switch and a fourth switch provided in series between the first input node and a ground and in parallel to the first switch and the second switch;
a fifth switch provided between the first input node and the first output node in parallel to the first switch and the second switch;
a sixth switch provided between the first output node and the ground; and
a first capacitor having a first end coupled between the first switch and the second switch and a second end coupled between the third switch and the fourth switch.

9. The multi-mode power management circuit of claim 8 wherein:
the control circuitry is further configured to control the first charge pump circuitry to provide the first voltage to the 2G amplifier circuit; and
the 2G amplifier circuit is further configured to amplify the 2G RF signal to the defined power corresponding to the first voltage multiplied by the sum of the first current and the second current.

10. The multi-mode power management circuit of claim 9 wherein the first voltage is provided as an average power tracking (APT) voltage.

11. The multi-mode power management circuit of claim 9 wherein the control circuitry is further configured to:
close the first switch, the second switch, the fourth switch, and the fifth switch; and
open the third switch and the sixth switch.

12. The multi-mode power management circuit of claim 8 wherein:

the control circuitry is further configured to control the second charge pump circuitry to provide the second voltage to the 2G amplifier circuit; and
the 2G amplifier circuit is further configured to amplify the 2G RF signal to the defined power corresponding to the second voltage multiplied by the sum of the first current and the second current.

13. The multi-mode power management circuit of claim 12 wherein the second voltage is provided as an average power tracking (APT) voltage.

14. The multi-mode power management circuit of claim 12 wherein the control circuitry is further configured to:
close the first switch, the second switch, the fourth switch, and the fifth switch; and
open the third switch and the sixth switch.

15. The multi-mode power management circuit of claim 1 wherein the switching circuitry further comprises:
an auxiliary output port;
a first input port coupled to the first tracker output;
a second input port coupled to the second tracker output;
a third input port coupled to the first tracker output;
a fourth input port coupled to a ground;
a first input switch and a second input switch provided in series between the first input port and the second input port, wherein the first input switch is coupled to the second input switch at a first coupling node and the first coupling node is coupled to the 2G output port;
a first output switch and a second output switch provided in series between the third input port and the fourth input port, wherein the first output switch is coupled to the second output switch at a second coupling node and the second coupling node is coupled to the auxiliary output port; and
a decoupling capacitor having a first end coupled to the 2G output port and a second end coupled to the auxiliary output port.

16. The multi-mode power management circuit of claim 15 wherein the 2G amplifier circuit is coupled to the first end of the decoupling capacitor.

17. The multi-mode power management circuit of claim 16 wherein the control circuitry is further configured to close the second output switch to couple the auxiliary output port to the ground in the 2GHP mode.

18. The multi-mode power management circuit of claim 15 further comprising:
a first non-2G amplifier circuit coupled to the auxiliary output port and configured to amplify a non-2G RF signal for transmission in at least one first non-2G RF band; and
a second non-2G amplifier circuit coupled to the 2G output port and configured to amplify the non-2G RF signal for transmission in at least one second non-2G RF band.

19. The multi-mode power management circuit of claim 18 wherein:
the non-2G RF signal is encoded based on a communication protocol selected from the group consisting of: a third-generation (3G) communication protocol; a fourth-generation (4G) communication protocol; and a fifth-generation (5G) communication protocol; and
the non-2G RF signal is amplified for transmission in an RF band selected from the group consisting of: a 3G RF band; a 4G RF band; and a 5G RF band.

20. The multi-mode power management circuit of claim 18 wherein in an uplink carrier aggregation (ULCA) mode, the control circuitry is further configured to:

close the first output switch to couple the first non-2G amplifier circuit to the first tracker output; and close the second input switch to couple the second non-2G amplifier circuit to the second tracker output.

21. The multi-mode power management circuit of claim 20 wherein in the ULCA mode, the control circuitry is further configured to open the second output switch to decouple the decoupling capacitor from the auxiliary output port.

* * * * *